United States Patent [19]
Livengood

[11] Patent Number: 6,153,891
[45] Date of Patent: Nov. 28, 2000

[54] METHOD AND APPARATUS PROVIDING A CIRCUIT EDIT STRUCTURE THROUGH THE BACK SIDE OF AN INTEGRATED CIRCUIT DIE

[75] Inventor: Richard H. Livengood, Los Gatos, Calif.

[73] Assignee: Intel Corporation, Santa Clara, Calif.

[21] Appl. No.: 08/940,830

[22] Filed: Sep. 30, 1997

Related U.S. Application Data

[63] Continuation-in-part of application No. 08/724,223, Oct. 2, 1996, Pat. No. 5,952,247, which is a continuation of application No. 08/344,149, Nov. 23, 1994, abandoned, which is a continuation-in-part of application No. 08/771,273, Dec. 20, 1996, which is a continuation-in-part of application No. 08/771,712, Dec. 20, 1996, Pat. No. 5,948,217.

[51] Int. Cl.[7] .................................................. H01L 23/58
[52] U.S. Cl. .............................. 257/48; 438/4; 438/14; 216/58; 216/59
[58] Field of Search .................................. 257/48; 438/4, 438/14; 216/58, 59

[56] References Cited

U.S. PATENT DOCUMENTS

| | | | |
|---|---|---|---|
| 4,632,724 | 12/1986 | Chesebro et al. ...................... | 156/626.1 |
| 4,650,744 | 3/1987 | Amano .................................. | 156/626.1 |
| 4,732,646 | 3/1988 | Elsner et al. .......................... | 156/626.1 |
| 5,037,771 | 8/1991 | Lipp . | |
| 5,064,498 | 11/1991 | Miller ................................... | 156/626.1 |
| 5,268,065 | 12/1993 | Grupen-Shemansky ............. | 156/626.1 |
| 5,438,166 | 8/1995 | Carey et al. . | |
| 5,701,666 | 12/1997 | DeHaven et al. . | |
| 5,838,625 | 11/1998 | Cutter et al. . | |
| 5,840,627 | 11/1998 | Huggins . | |
| 5,843,844 | 12/1998 | Miyanaga . | |
| 5,844,295 | 12/1998 | Tsukude et al. . | |
| 5,904,486 | 5/1999 | Livengood et al. ........................ | 438/4 |
| 5,948,217 | 9/1999 | Winer et al. ............................. | 438/474 |
| 5,976,980 | 11/1999 | Livengood et al. ..................... | 438/691 |
| 6,001,703 | 12/1999 | Winer et al. ............................. | 438/401 |

FOREIGN PATENT DOCUMENTS

| | | | |
|---|---|---|---|
| 0 295 065 | 12/1988 | European Pat. Off. ............ | 156/627.1 |
| 56-46534 | 4/1981 | Japan .................................. | 156/626.1 |
| 59-44827 | 3/1984 | Japan .................................. | 156/626.1 |
| 1-119037 | 5/1989 | Japan .................................. | 156/627.1 |

OTHER PUBLICATIONS

Paul Winer, "IC Failure Analysis, E–Beam Tutorial," International Reliability and Physics Symposium, 1996.

Scott Silverman, "Laser Microchemical Technology Enables Real–Time Editing of First–Run Silicon," Solid State Technology, 1996.

Ann N. Campbell, Fault Localization with the Focused Ion Beam (FIB) System, in Microelectronic Failure Analysis, ASM International, 1996.

*Primary Examiner*—Kevin M. Picardat
*Attorney, Agent, or Firm*—Blakely, Sokoloff, Taylor & Zafman LLP

[57] ABSTRACT

A method and an apparatus providing a circuit edit structure to an integrated circuit enabling circuit edits to be performed through the back side of an integrated circuit die. In one embodiment, a passive diffusion is disposed in the substrate of a flip-chip packaged integrated circuit die. A plurality of contacts couple the passive diffusion to a signal line disposed in a dielectric isolation layer of the integrated circuit die. In another embodiment, the signal line includes an uninterrupted length of approximately 3.0 microns beneath a field oxide region in the integrated circuit die, which provides a circuit edit cut location. The passive diffusion and circuit edit cut locations may be accessed through the back side of the flip-chip packaged integrated circuit, which enable circuit edits to be performed on the flip-chip packaged integrated circuit.

13 Claims, 8 Drawing Sheets

METHOD AND APPARATUS PROVIDING A CIRCUIT EDIT STRUCTURE THROUGH THE BACK SIDE OF AN INTEGRATED CIRCUIT DIE

RELATED APPLICATIONS

This application is a continuation-in-part application Ser. No. 08/724,223, filed Oct. 2, 1996, entitled "A Method of Accessing the Circuitry on a Semiconductor Substrate from the Bottom of the Semiconductor Substrate now U.S. Pat. No. 5,952,247," and assigned to the Assignee of the present application, which is a continuation of application Ser. No. 08/344,149, filed Nov. 23, 1994, now abandoned.

This application is also a continuation-in-part of co-pending application Ser. No. 08/771,273, filed Dec. 20, 1996, entitled "Method and Apparatus for Editing an Integrated Circuit," and assigned to the Assignee of the present application.

This application is also a continuation-in-part of application Ser. No. 08/771,712, filed Dec. 20, 1996, entitled "Method and Apparatus for Endpointing While Milling an Integrated Circuit," now U.S. Pat. No. 5,948,217 and assigned to the Assignee of the present application.

This application is also related to co-pending application Ser. No. 08/941,888 filed Sep. 30, 1997 entitled "Method and Apparatus For Probing An Integrated Circuit Through the Back Side of an Integrated Circuit Die," and assigned to the Assignee of the present application.

This application is also related to application Ser. No. 08/940,624 filed Sep. 30, 1997 entitled "Method and Apparatus For Performing A Circuit Edit Through the Back Side of an Integrated Circuit Die," now U.S. Pat. No. 5,904,486 and assigned to the Assignee of the present application.

This application is also related to application Ser. No. 08/941,887 filed Sep. 30, 1997 entitled "Method and Apparatus Providing a Mechanical Probe Structure in an Integrated Circuit Die," now U.S. Pat. No. 5,976,480 and assigned to the Assignee of the present application.

FIELD OF THE INVENTION

The present invention relates generally to the field of integrated circuit testing and, more particularly, to a method and an apparatus enabling circuit edits in an integrated circuit for the purpose of verifying design engineering change orders.

BACKGROUND INFORMATION

Once a newly designed integrated circuit has been formed on a semiconductor substrate, the integrated circuit must be thoroughly tested to ensure that the circuit performs as designed. Portions of the integrated circuit that do not function properly are identified so that they can be fixed by correcting the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

Figure 1A:
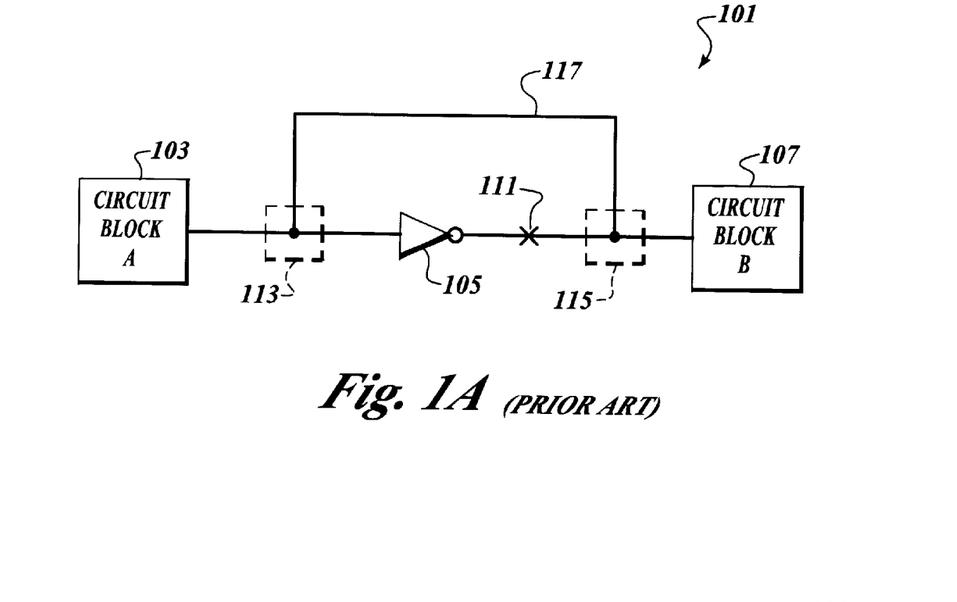
FIG. 1A is a schematic showing a circuit edit performed on an integrated circuit.

During the debugging process, it is sometimes necessary to add, delete or reroute signal line connections within the integrated circuit. For instance, assume that FIG. 1A shows an integrated circuit 101 that requires edits to be made. In this example, circuit block A 103 is coupled to circuit block B 107 through inverter 105. If it is determined during the debug process that the signal from circuit block A 103 should not be inverted when received by circuit block B 107, integrated circuit 101 may be edited in a way such that inverter 105 is effectively removed from integrated circuit 101 and that circuit block A 103 is directly connected to circuit block B 107.

Using prior art techniques, integrated circuit 101 may be edited as follows. Inverter 105 may be disconnected from circuit block A 103 and circuit block B 107 by physically cutting the signal line through the front side of the integrated circuit die as shown in FIG. 1 with cut 111. After cut 109 111 is made, circuit block A 103 is no longer connected to circuit block B 107 through inverter 105. In order to reconnect circuit block A 103 and circuit block B 107, dielectric is removed from the front side of the integrated circuit die at locations 113 and 115 to expose the buried metal of the signal line connected to circuit block A 103 and circuit block B 107. After the dielectric is removed from the signal line at locations 113 and 115, a new metal line 117 is deposited over the dielectric on the front side of the integrated circuit die and over the exposed pieces of metal at locations 113 and 115 to directly connect circuit block A 103 to circuit block B 107.

Figure 1B:
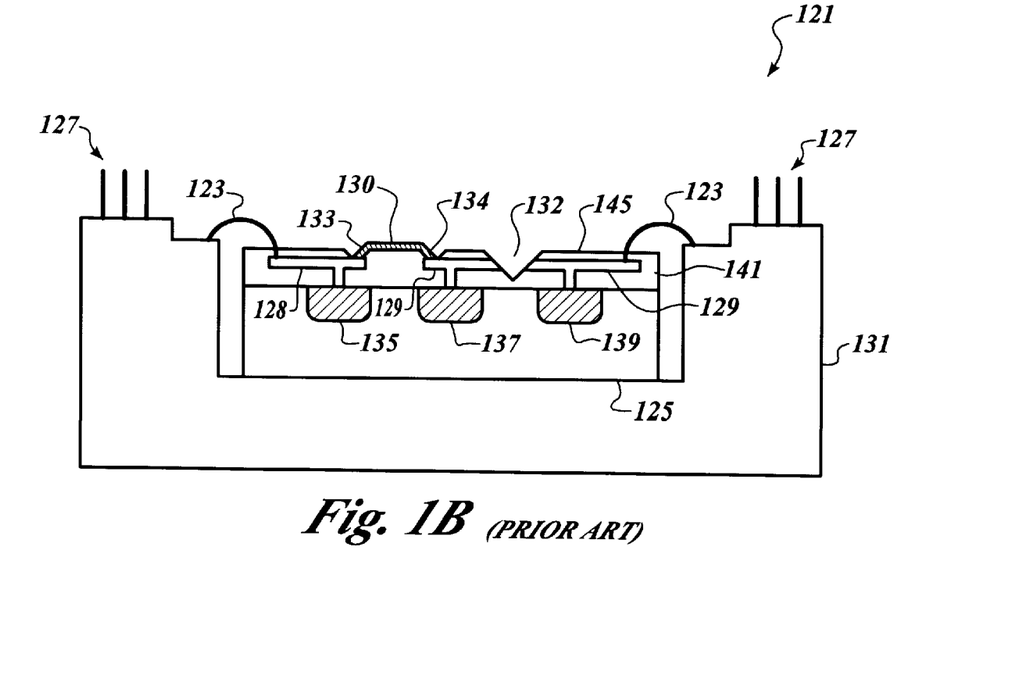
FIG. 1B is an illustration of a cross-section of a wire bond packaged integrated circuit die showing a circuit edit performed on an integrated circuit.

FIG. 1B is an illustration of a cross-section of an integrated circuit package 121 including an integrated circuit die 125 on which circuit edits have been performed. As shown in FIG. 1B, integrated circuit package 121 includes wire bonds 123 disposed along the periphery of integrated circuit die 125 to electrically connect integrated circuit connections through metal interconnects 128 and 129 to pins 127 of the package substrate 131. Metal interconnects 128 and 129 are disposed in a dielectric isolation layer 141 of integrated circuit die 125, and are coupled to diffusion regions 135, 137 and 139.

It is noted that before the circuit edits shown in FIG. 1B were performed in integrated circuit die 125, diffusion 137 was coupled to diffusion 139 through metal interconnect 129. In addition, diffusion 135 was not coupled to diffusion 137. FIG. 1B shows circuit edits that have been performed to disconnect diffusion 137 from diffusion 139 and connect diffusion 135 to diffusion 137. As shown in FIG. 1B, diffusion 137 has been disconnected from diffusion 139 with metal interconnect 129 being physically cut by milling a hole 132 through the dielectric isolation layer 141 from the front side 145 of integrated circuit die 125. As shown in FIG. 1B, diffusion 137 has been disconnected from diffusion 139 as a result of hole 132. As shown in FIG. 1B, circuit edits have also been performed to connect diffusion 135 to diffusion 137. A hole 133 has been milled through dielectric isolation layer 141 from the front side 145 of integrated circuit die 125 to expose a portion of metal interconnect 128. Similarly, a hole 134 has been milled through dielectric isolation layer 141 from the front side 145 of integrated circuit die 125 to expose a portion of dielectric isolation layer 129. A conductor 130 has then been deposited over the dielectric isolation layer 141 and holes 133 and 134 to connect metal interconnect 128 to metal interconnect 129, thereby connecting diffusion 135 to diffusion 137.

As mentioned above, it is noted that integrated circuit package 121 of FIG. 1B is of a wire bond design. There are several disadvantages associated with the wire bond design of integrated circuit package 121. One problem stems from the fact that as the density and complexity of integrated circuit die 125 increases, so must the number of wire bonds 123 required to control the functions integrated circuit die 125. However, there are only a finite number of wire bonds 123 that can fit along the periphery of integrated circuit die 125. One way to fit more wire bonds 125 along the periphery of integrated circuit die 125 is to increase the overall size of integrated circuit die 125, thereby increasing its peripheral area. Unfortunately, an increase in the overall size of integrated circuit die 125 also significantly increases the integrated circuit manufacturing costs.

Another disadvantage with integrated circuit package 121 of FIG. 1B is that the active circuitry within integrated circuit die 125 must be routed through metal interconnects 128 and 129 to the peripheral region of integrated circuit die 125 in order to electrically couple the active circuitry to wire bonds 123. By routing metal interconnect lines 128 and 129 over a relatively long distance across the integrated circuit die 125, the increased resistive, capacitive and inductive effects of these lengthy interconnect lines results in an overall speed reduction of the integrated circuit device. In addition, the inductance of wire bonds 103 may also severely limit high frequency operation of integrated circuit devices in integrated circuit package 121.

With continuing efforts in the integrated circuit industry to increase integrated circuit speeds as well device densities, there is a trend towards using flip-chip technology when packaging complex high speed integrated circuits. Flip-chip technology is also known as controlled collapse chip connection (C4) packaging. In flip-chip packaging technology, the integrated circuit die is flipped upside-down. This is opposite to how integrated circuits are packaged today using wire bond technology, as illustrated in FIG. 1B. By flipping the integrated circuit die upside-down, ball bonds may be used to provide direct electrical connections from the bond pads directly to the pins of a flip-chip package.

Figure 1C:
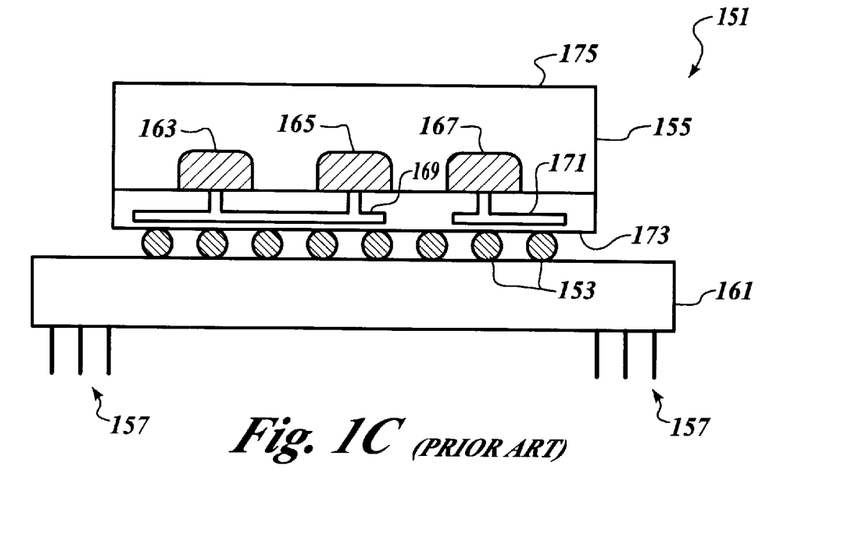
FIG. 1C is an illustration of a cross-section of a flip-chip or C4 packaged integrated circuit die.

To illustrate, FIG. 1C shows a flip-chip package 151 with an integrated circuit die 155 flipped upside-down relative to wire bonded integrated circuit die 125 of FIG. 1B. In comparison with wire bonds 123 of FIG. 1B, ball bonds 153 of flip-chip package 151 provide more direct connections between the circuitry in integrated circuit die 155 and the pins 157 of package substrate 161 through metal interconnects 169 and 171. As a result, the inductance problems that plague the typical wire bond integrated circuit packaging technologies are reduced. Unlike wire bond technology, which only allows bonding along the periphery of the integrated circuit die 155, flip-chip technology allows connections to be placed anywhere on the integrated circuit die surface. This results in reduced inductance power distribution to the integrated circuit which is another major advantage of flip-chip technology.

One consequence of integrated circuit die 155 being flipped upside-down in flip-chip package 151 is that access to the internal nodes of integrated circuit die 155 for circuit edit purposes has become a considerable challenge. As illustrated in FIG. 1B, prior art circuit editing techniques used with wire bond technology are based on performing the circuit edits on metal interconnects 128 and 129 through the front side 145 of the integrated circuit die 125. However, with flip-chip packaging technology, this front side methodology is not feasible since the integrated circuit die is flipped upside-down. For example, as illustrated in FIG. 1C, circuit edit access to metal interconnects 169 and 171 through the front side 173 of integrated circuit die 155 is obstructed by package substrate 161. In addition, diffusion regions 163, 165 and 167 obstruct circuit edit access to metal interconnects 169 and 171 from the back side 175 of the semiconductor substrate of integrated circuit die 155.

Thus, what is desired is a method and apparatus providing a circuit edit structure enabling circuit edits to be performed on flip-chip packaged integrated circuits through the back side of an integrated circuit die.

SUMMARY OF THE INVENTION

A method and an apparatus providing a circuit edit structure enabling circuit edits to be performed on an integrated circuit is disclosed. In one embodiment, a circuit edit structure is described. The circuit edit structure includes a passive diffusion disposed in a semiconductor substrate of the integrated circuit die. A plurality of contacts are coupled to the passive diffusion to couple the passive diffusion to a signal line disposed in a dielectric isolation layer of the integrated circuit die. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus providing a circuit edit structure to an integrated circuit is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention. While the diagrams representing embodiments of the present inventions are illustrated in FIGS. 2A–6, these illustrations are not intended to limit the invention. The specific processes described herein are only meant to help clarify an understanding of the present invention and to illustrate various embodiments of how the present invention may be implemented in order to achieve a desired result. For the purposes of this discussion, a semiconductor substrate may be a substrate including any material or materials used in the manufacture of a semiconductor device.

The present invention is directed to a method and an apparatus that provides a novel circuit edit structure that enables circuit edits to be performed on flip-chip packaged integrated circuit dies. As discussed earlier, the editing of integrated circuits through the front side of an integrated circuit die is a useful technology for debugging newly developed microprocessors, micro-controllers, memory chips and the like. With the continuing migration of packaging technology from wire bond technology to flip-chip technology, as shown in FIGS. 1B and 1C respectively, it is desired to develop the capability to perform circuit edits through the back side of the integrated circuit die.

Figure 2A:
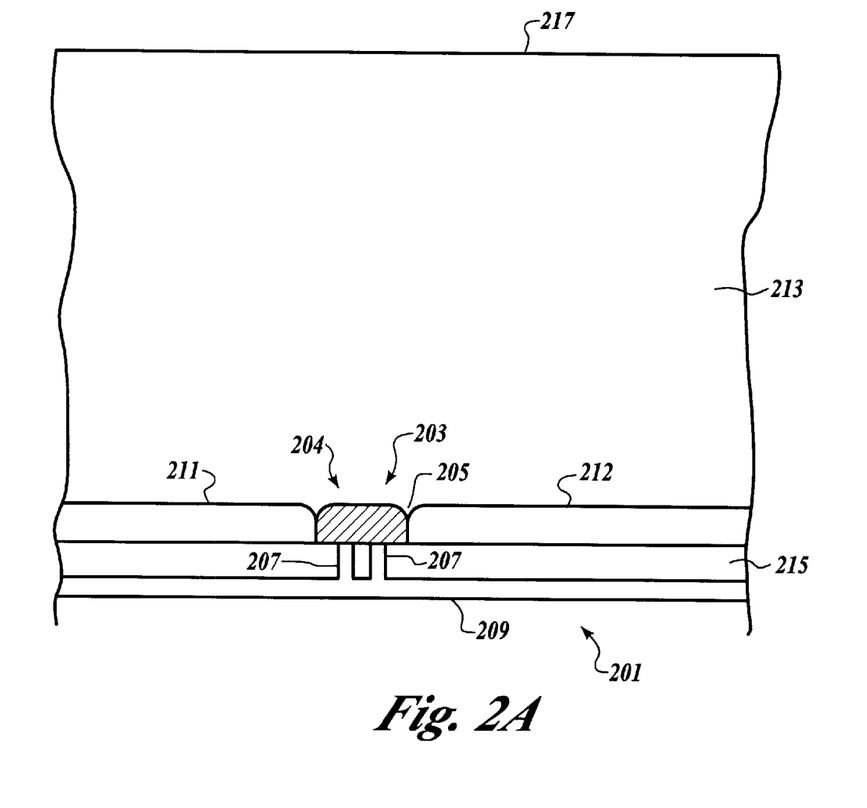
FIG. 2A is an illustration of a cross-section of a circuit edit structure in an integrated circuit die in accordance with the teachings of the present invention.

FIG. 2A is an illustration of a cross-section of a flip-chip packaged integrated circuit die 201 having a circuit edit structure 203 in accordance with the teachings of the present invention. As shown in the embodiment illustrated in FIG. 2A, circuit edit structure 203 includes circuit edit connection point 204 including passive diffusion 205 disposed in the semiconductor substrate 213 of integrated circuit die 201. In one embodiment, passive diffusion 205 is coupled to a signal line 209 through a plurality of contacts 207. For the purposes of this disclosure, a passive diffusion may simply be interpreted as a diffusion disposed in a semiconductor substrate for providing a signal access location. In one embodiment, passive diffusion 205 is an N+ diffusion in a P well. In another embodiment, passive diffusions 205 is a P+ diffusion in a P well.

In one embodiment, there are at least four contacts 207 coupling passive diffusion 205 to signal line 209. In another embodiment, there are more than four contacts 207 coupling passive diffusion 205 to signal line 209. In yet another embodiment, there are less than four contacts 207 coupling passive diffusion 205 to signal line 209. It is appreciated that by having more than one contact 207, the resistance between passive diffusion 205 and signal line 209 is reduced, thereby reducing undesired attenuation across circuit edit structure 203 for an added circuit edit connection.

In one embodiment, signal line 209 is disposed in a dielectric isolation layer 215 of integrated circuit die 201 and is coupled to a node (not shown) in a circuit of integrated circuit die 201 to which a circuit designer wishes to add a circuit edit connection. In one embodiment, signal line 209 is made of a conductive material, such as metal, polysilicon or the like. In another embodiment, passive diffusion 205 is surrounded by field oxide or trench isolation oxide in semiconductor substrate 213. In one embodiment, the semiconductor substrate 231 includes silicon. As illustrated in FIG. 2A, passive diffusion 205 is disposed in semiconductor substrate 213 between field oxide regions 211 and 212.

Figure 2B:
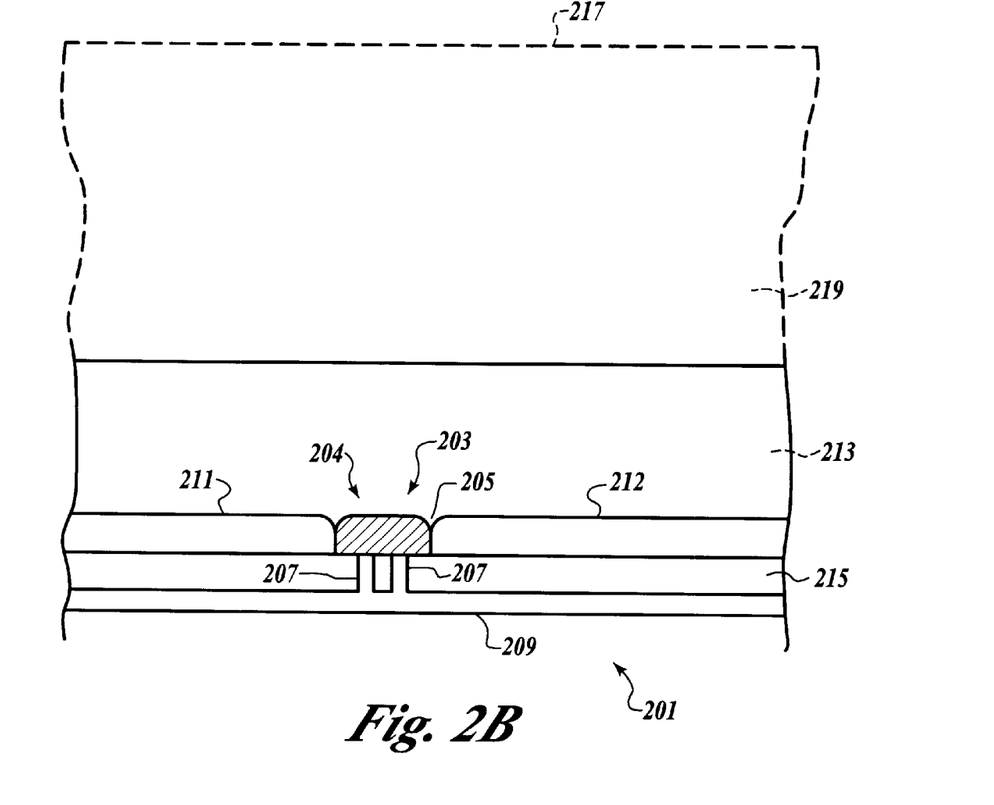
FIG. 2B is an illustration of a cross-section of a circuit edit structure in an integrated circuit die that is globally thinned and/or locally trenched from the back side of the integrated circuit die in accordance with the teachings of the present invention.

Circuit edit structure 203 may be used as a connection point when adding a circuit edit connection through the back side 217 of integrated circuit die 201. In one embodiment, flip-chip packaged integrated circuit die 201 is first thinned in the region above circuit edit structure 203 before coupling in the circuit edit connection in to circuit edit structure 203. This aspect of the present invention is illustrated in FIG. 2B with back side portion 219 of semiconductor substrate 213 being removed above passive diffusion 203 from back side 217. In one embodiment, integrated circuit die 201 is globally thinned to a thickness of approximately 200 microns using well known techniques such as for example but not limited to mechanical polishing, mechanical machining, chemical etching, or the like. In another embodiment, integrated circuit die 201 may be locally trenched in the region proximate to passive diffusion 203 to remove back side portion 219 using well known techniques. In yet another embodiment, integrated circuit die 201 is thinned using a combination of well known global and local thinning techniques.

It is noted that other useful techniques for thinning the flip-chip packaged integrated circuit die for access to structures in the integrated circuit through the back side are described in application Ser. No. 08/724,223, filed Oct. 2, 1996, entitled "A Method of Accessing the Circuitry on a Semiconductor Substrate From the Bottom of the Semiconductor Substrate," now U.S. Pat. No. 5,952,247 and assigned to the Assignee of the present application, which is a continuation application of Ser. No. 08/344,149, filed Nov. 23, 1994, now abandoned.

Figure 2C:
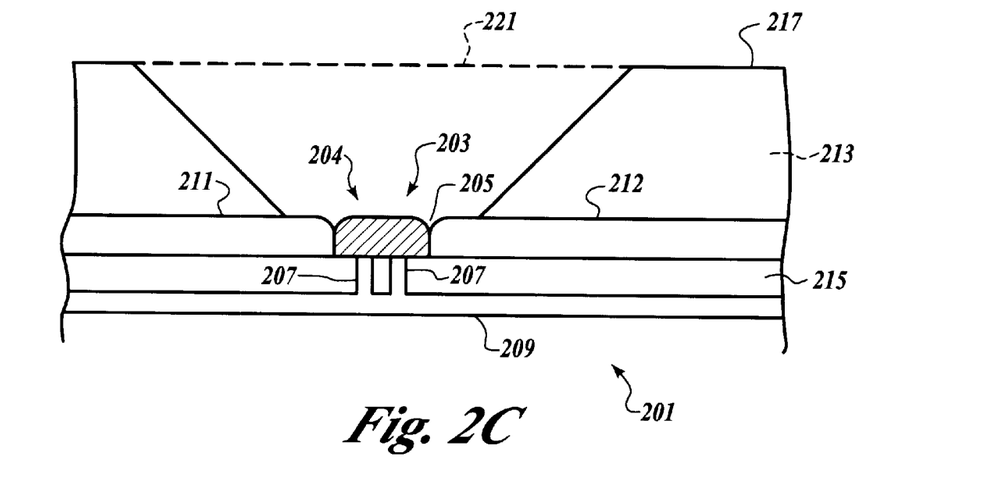
FIG. 2C is an illustration of a cross-section of a circuit edit structure in an integrated circuit die that is exposed in accordance with the teachings of the present invention.

After the thinning step shown in FIG. 2B, a portion 221 of the semiconductor substrate 213 above circuit edit structure 203 is milled away to expose circuit edit structure 203 from back side 217. This aspect of the present invention is illustrated in FIG. 2C. In one embodiment, circuit edit structure 203 is exposed by using well known milling techniques, such as for example a focused ion beam milling tool. In one embodiment, at least a portion of passive diffusion 205 is milled away and contacts 207 of circuit edit structure 203 are directly exposed from back side 217 through passive diffusion 205. It is noted that useful techniques for endpointing while milling an integrated circuit are described in co-pending application Ser. No. 08/771,712, filed Dec. 20, 1996, entitled "Method and Apparatus for Providing Endpointing While Milling an Integrated Circuit," and assigned to the Assignee of the present application.

After circuit edit structure 203 has been exposed as illustrated in FIG. 2C, a circuit edit connection may be coupled to circuit edit structure 203 to couple signal line 209 to another node in the integrated circuit. It is noted that useful techniques for depositing circuit edit connections are described in co-pending application Ser. No. 08/771,273, filed Dec. 20, 1996, entitled "Method and Apparatus for Editing an Integrated Circuit," and assigned to the Assignee of the present application. Additional useful techniques for providing circuit edit connections through the back side of an integrated circuit die are described in application Ser. No. 08/940,624, filed Sep. 20, 1997, entitled "Method and Apparatus for Performing a Circuit Edit through the Back Side of an Integrated Circuit Die," now U.S. Pat. No. 5,904,486 and assigned to the Assignee of the present application.

Figure 3A:
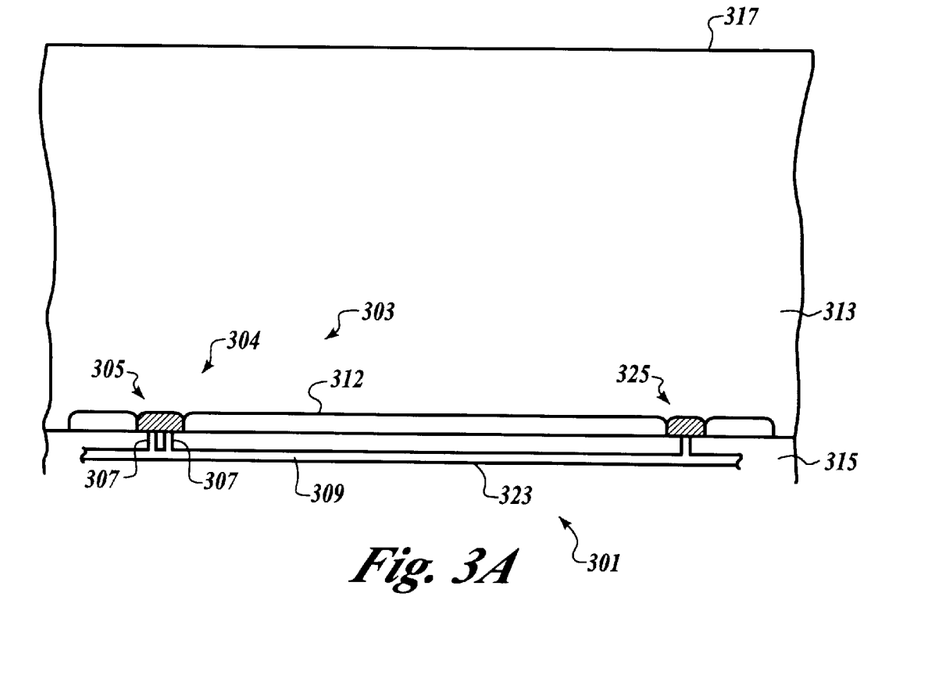
FIG. 3A is an illustration of a cross-section of a circuit edit structure including a circuit edit cut location in an integrated circuit die in accordance with the teachings of the present invention.

FIG. 3A is an illustration of a cross-section of a flip-chip packaged integrated circuit die 301 having another embodiment of a circuit edit structure 303 in accordance with the teachings of the present invention. As shown in the embodiment illustrated in FIG. 3A, circuit edit structure 303 includes circuit edit connection point 304 including passive diffusion 305 disposed in the semiconductor substrate 313 of integrated circuit die 301. In one embodiment, passive diffusion 305 is coupled to a signal line 309 through a plurality of contacts 307. In one embodiment, signal line 309 is disposed in a dielectric isolation layer 315 of integrated circuit die 301.

In the embodiment shown, signal line circuit edit structure 303 also includes a circuit edit cut location 323, located in signal line 309 at approximately a center of an uninterrupted length of signal line 309. In the embodiment illustrated in FIG. 3A, circuit edit cut location 323 is located at approximately the center of signal line 309 between passive diffusion 305 and nearby diffusion 325 below field oxide region 312. In one embodiment, there are at least 3.0 microns of uninterrupted length of signal line 309 between passive diffusion 305 and nearby diffusion 325. As shown in FIG. 3A, there is access to circuit edit cut location 323 from the back side 317 of integrated circuit die 301 through semiconductor substrate 313, field oxide region 312 and dielectric isolation layer 315.

Figure 3B:
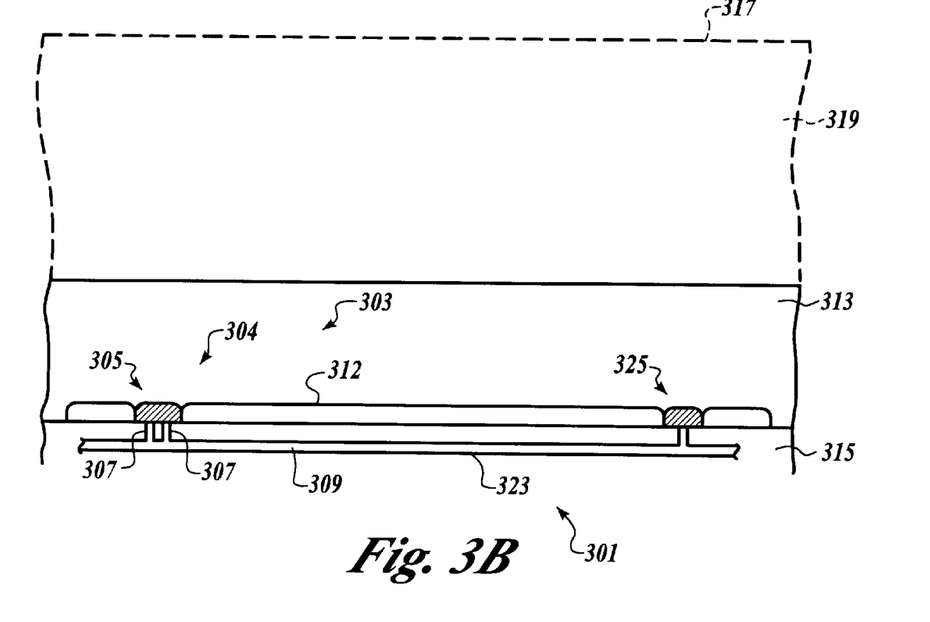
FIG. 3B is an illustration of a cross-section of a circuit edit structure including a circuit edit cut location in an integrated circuit die in that it is globally thinned and/or locally trenched from the back side of the integrated circuit die in accordance with the teachings of the present invention.

In one embodiment, signal line 309 may provide an unwanted signal path between passive diffusion 305 and nearby diffusion 325. As such, a circuit designer may wish to edit the integrated circuit by cutting signal line 309. In one embodiment, signal line 309 may be cut at circuit edit cut location 323 as follows. Initially, flip-chip packaged integrated circuit die 301 is first thinned in the region above circuit edit cut location 323. This aspect of the present invention is illustrated in FIG. 3B with back side portion 319 of semiconductor substrate 313 being removed above circuit edit cut location 323 from back side 317. In one embodiment, integrated circuit die 301 is globally thinned to a thickness of approximately 200 microns using well known polishing techniques. In another embodiment, integrated circuit die 301 may be locally trenched in the region above circuit edit cut location 323 to remove back side portion 319 using well known techniques.

Figure 3C:
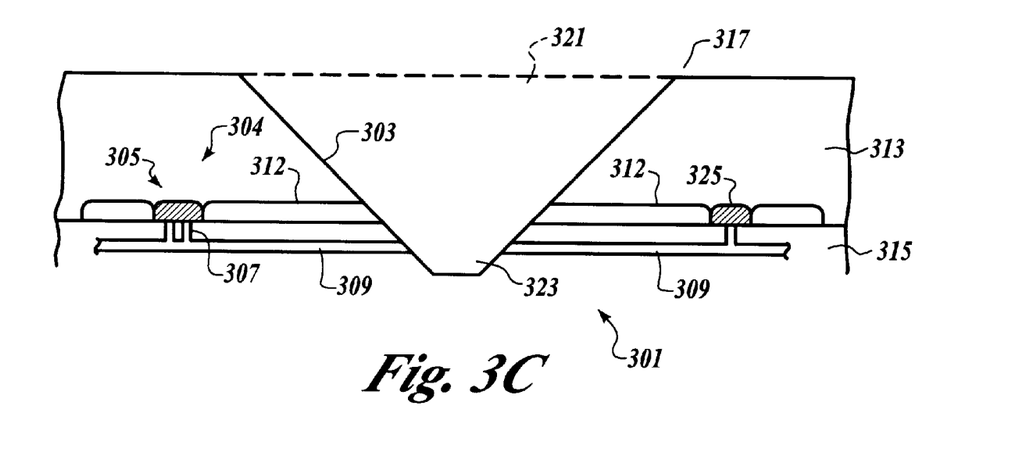
FIG. 3C is an illustration of a cross-section of a circuit edit structure including a circuit edit cut location in an integrated circuit die that is cut in accordance with the teachings of the present invention.

After the thinning step shown in FIG. 3B, integrated circuit die 301 is milled to cut signal line 309 at circuit edit cut location 323. This aspect of the present invention is illustrated in FIG. 3C, which is a cross-section of integrated circuit die 301 showing circuit edit cut location 323 cut from the back side 317 of an integrated circuit die 301 through the semiconductor substrate 313 and field oxide region 312. In one embodiment, circuit edit cut location 323 is cut by using well known milling techniques, such as for example a focused ion beam milling tool. It is noted that additional structures and techniques used for disconnecting integrated circuit nodes from one another through the back side of an integrated circuit die are described in application Ser. No. 08/940,624, filed Sep. 30, 1997, entitled "Method and Apparatus for Performing a Circuit Edit through the Back Side of an Integrated Circuit Die," now U.S. Pat. No. 5,904,486 and assigned to the Assignee of the present application.

Figure 4:
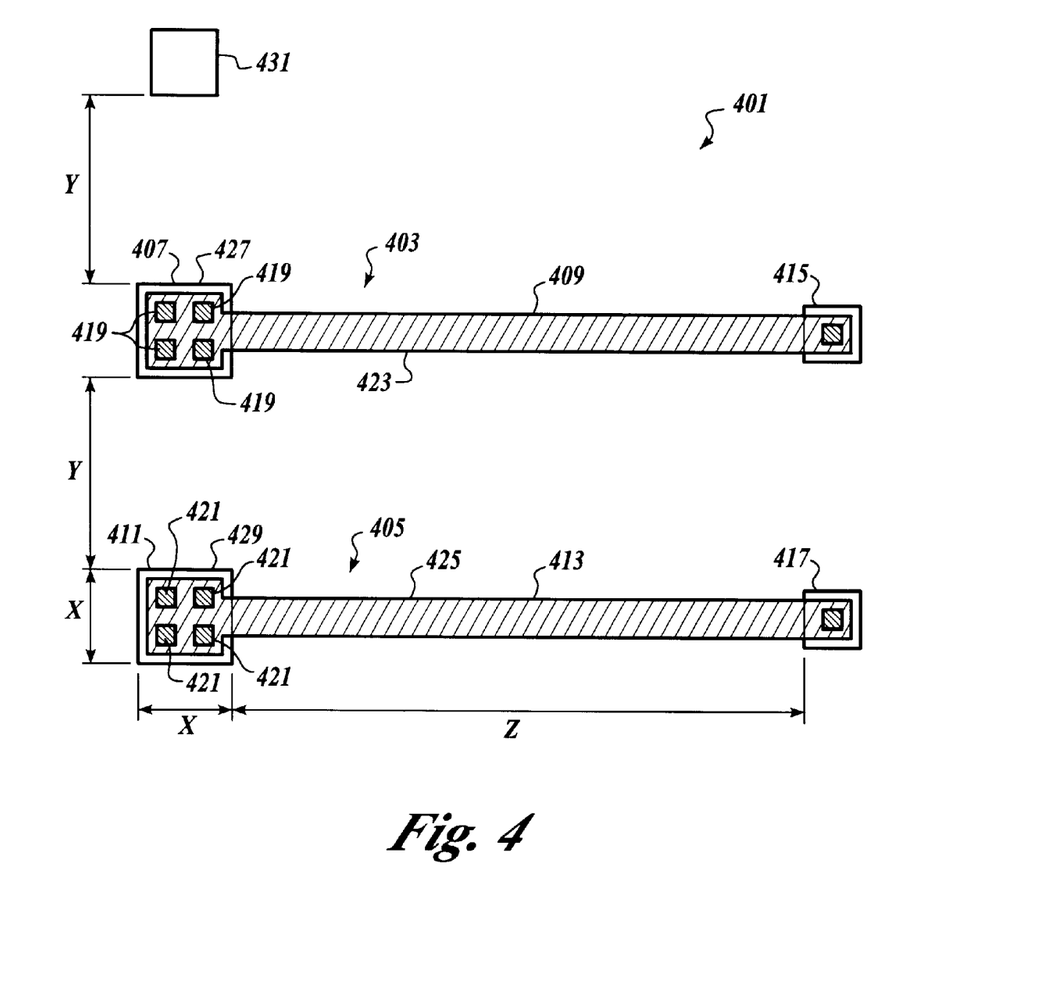
FIG. 4 is a top view diagram of an integrated circuit die having circuit edit structures in accordance with the teachings of the present invention.

FIG. 4 is a top view diagram of a flip-chip packaged integrated circuit die 401 showing circuit edit structures 403 and 405 in accordance with the teachings of the present invention. Circuit edit structure 403 includes circuit edit connection location 407 and circuit edit cut location 409. Circuit edit structure 405 includes circuit edit connection location 411 and circuit edit cut location 413. Circuit edit connection location 407 includes passive diffusion 427, which is coupled to signal line 423 through plurality of contacts 419. Circuit edit connection location 411 includes passive diffusion 429, which is coupled to signal line 425 through plurality of contacts 421. Circuit cut location 409 is located at approximately a center of an uninterrupted length of signal line 423. As shown in FIG. 4, one embodiment of circuit edit cut location 409 is located at approximately the center of the uninterrupted length of signal line 423 between passive diffusion 427 of circuit edit connection location 407 and diffusion 415. Similarly, circuit edit cut location 413 is located at approximately the center of the uninterrupted length of signal line 425 disposed between diffusion 429 and diffusion 417.

In one embodiment, passive diffusions 427 and 429 of circuit edit connection locations 407 and 411 are oversized in comparison to other active diffusions in the semiconductor substrate to reduce attenuation of signals that connect top passive diffusions 427 and 429. For the purposes of this disclosure, an active diffusion may be interpreted as a diffusion disposed in a semiconductor substrate that is functionally active during normal operation of the circuit. In one embodiment, passive diffusions 427 and 429 have a width at least X microns and a cross-sectional area of at least $X^2$ square microns. In another embodiment, the distance between passive diffusion 427 and another passive diffusion 429 or active diffusion 431 is at least Y microns. In yet another embodiment, the uninterrupted length of signal lines 423 and 425 is at least Z microns. In one embodiment, X is at least 1.0 microns, Y is at least 1.0 microns, and Z is at least 3.0 microns. With the cross-sectional areas of at least 1.0 square microns, passive diffusions 427 and 429 provide good circuit edit connection locations with reduced attenuation of signals. By laterally spacing passive diffusions 427 and 429 at least Y microns apart, adequate access is provided to enable passive diffusions 427 and 429 to be exposed for circuit edits. In addition, by providing at least 3.0 microns of uninterrupted signal line length, circuit cut locations 409 and 413 are provided with adequate access from the back side of the integrated circuit die. It is noted that other techniques for laterally spacing integrated circuit structures to enable access through the back side of an integrated circuit die are described in co-pending application Ser. No. 08/941,888, filed Sep. 30, 1997, entitled "Method and Apparatus For Probing An Integrated Circuit Through the Back Side of An Integrated Circuit Die," and assigned to the Assignee of the present application.

Figure 5A:
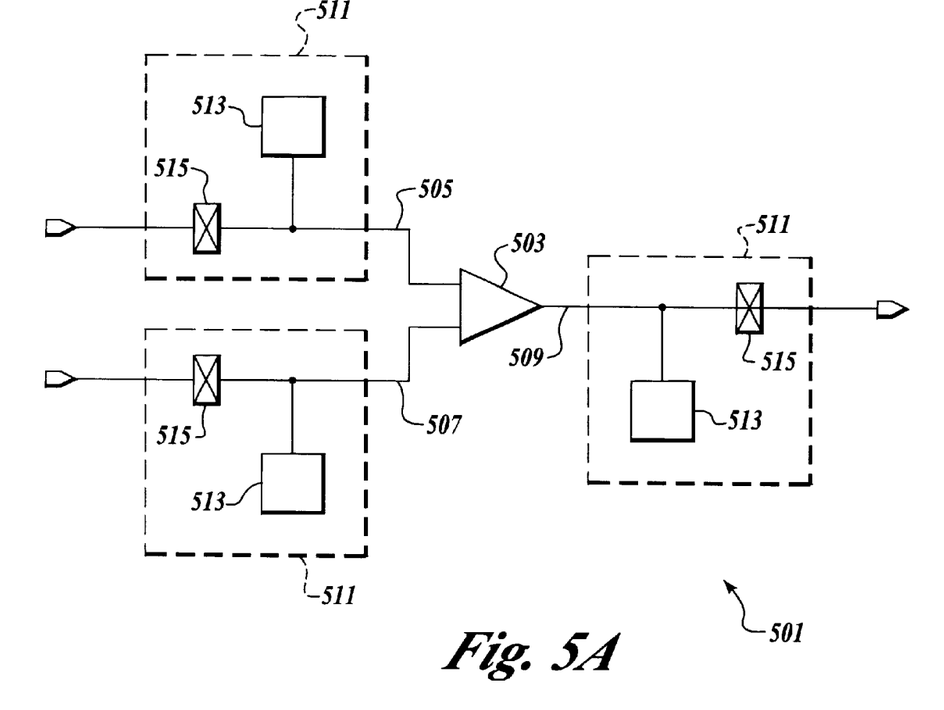
FIG. 5A is a schematic of an integrated circuit including one embodiment of connectivity cells having circuit edit structures in accordance with the teachings of the present invention.

FIG. 5A is a schematic of an integrated circuit 501 including circuit edit structures in accordance with the teachings of the present invention. As shown in FIG. 5A, integrated circuit 501 includes a circuit 503 including input 505, input 507 and output 509. In one embodiment, the presently described circuit edit structure is included in a connectivity cell 511, which is included in the cell library of an integrated circuit designer. In the embodiment shown in FIG. 5A, connectivity cells 511 are connected to each input 505 and 507 and output 509 to enable circuit edits to be performed on each input and output of circuit 503. As illustrated in FIG. 5A, each connectivity cell 511 includes a circuit edit connection location 513 and a circuit edit cut location 515.

By including the presently described circuit edit structures in a connectivity cell 511, integrated circuit designers may incorporate connectivity cells 511, including circuit edit connection locations 513 and circuit edit cut locations 515 in locations of the integrated circuit 501 wherever the circuit designer anticipates the need to perform circuit edits. Thus, for example, if the circuit designer later wishes to disconnect input 505 from circuit 503, circuit edit cut location 515 may be cut at input 505 in accordance with the teachings of the present invention.

Figure 5B:
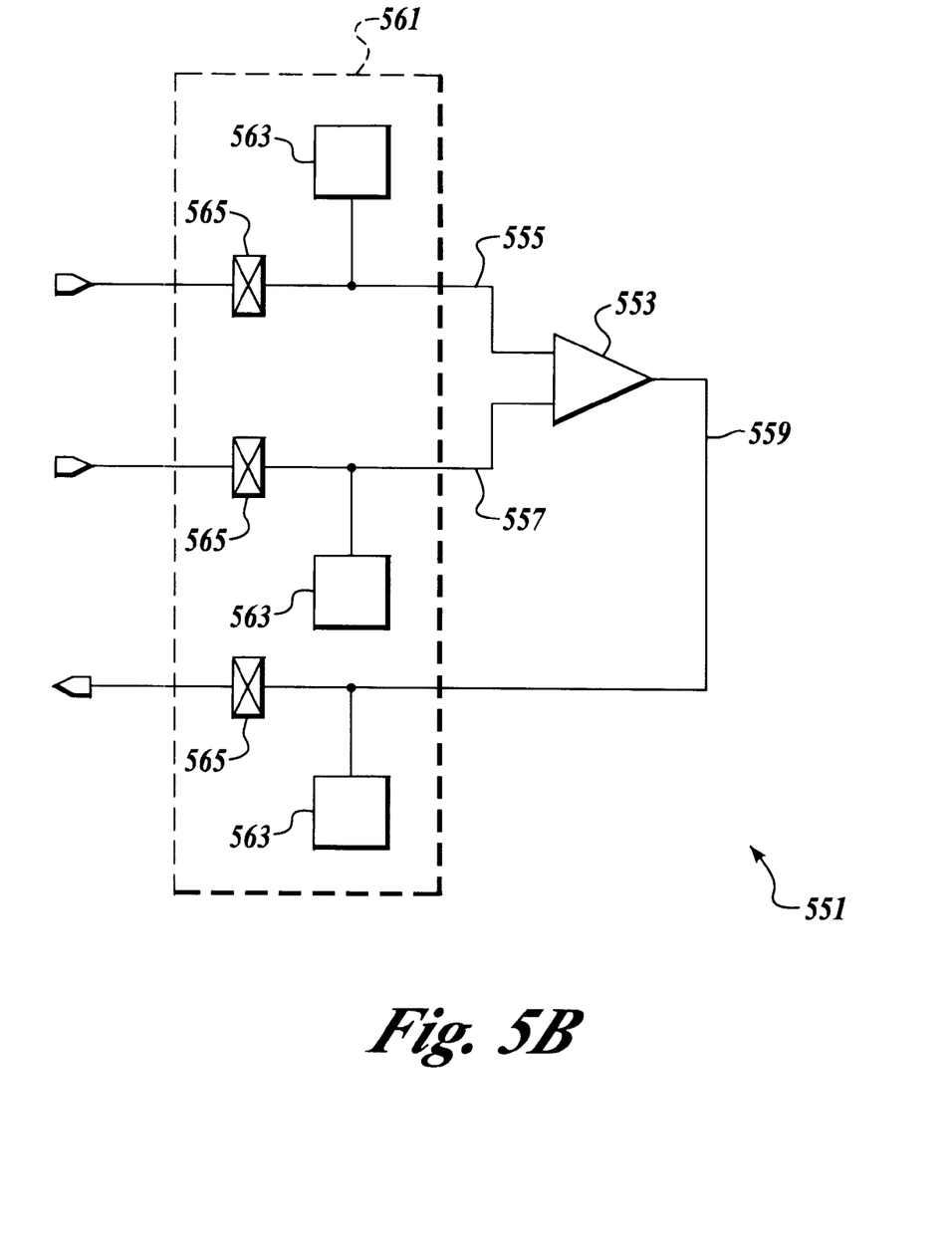
FIG. 5B is a schematic of an integrated circuit including another embodiment of a connectivity cell having circuit edit structures in accordance with the teachings of the present invention.

FIG. 5B is a schematic of another integrated circuit 551 including circuit 553, which includes input 555, input 557 and output 559. In the embodiment shown in FIG. 5B, connectivity cell 561 incorporates a plurality of circuit edit cut locations and circuit edit connection locations in accordance with the teachings of the present invention. Specifically, connectivity cell 561 includes circuit edit connection location 563 and circuit edit cut location 565 coupled to input 555. Circuit edit connection location 567 and circuit edit cut location 569 are coupled to input 557. Circuit edit connection location 571 and circuit edit cut location 573 are coupled to output 559. As such, connectivity cell 561 provides circuit edit connection locations and cut locations for every input and output of circuit 553.

It is appreciated that other variations of connectivity cells 511 and 561 of FIGS. 5A and 5B are only two of a countless number of different integrated circuit cell library combinations that may be implemented to provide flexibility at design time when designing integrated circuits that may be edited in the future.

Figure 6:
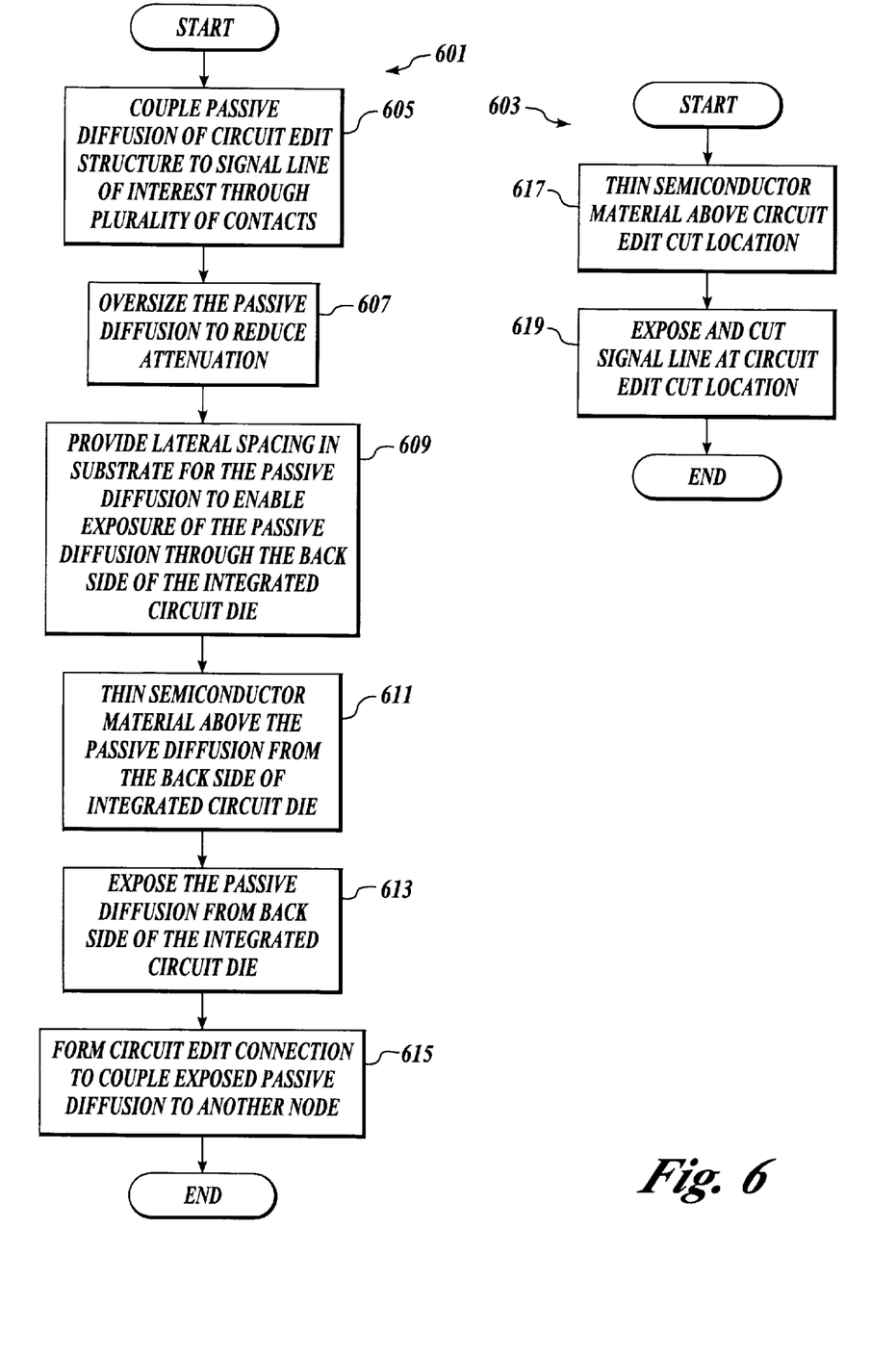
FIG. 6 is a flow chart illustrating the steps performed to perform circuit edits using the disclosed circuit edit structure in accordance with the teachings of the present invention.

Flow charts 601 and 603 of FIG. 6 show circuit edit steps performed in accordance with the teachings of the present invention. When providing a circuit edit structure, flow chart 601 shows that a passive diffusion of the circuit edit structure is coupled to a signal line of interest through a plurality of contacts in processing block 605. As shown in processing block 607, the passive diffusion is oversized in comparison to other active diffusions in the semiconductor substrate to reduce attenuation. In addition, the passive diffusion is laterally spaced from other integrated circuit structures to enable exposure of the passive diffusion from the back side if the integrated circuit die without damaging other structures, as shown in processing block 609. When a circuit edit connection is to be added, the semiconductor is first thinned above the passive diffusion, as shown in processing block 611. Next, the passive diffusion exposed from the back side of the integrated circuit die to allow the circuit edit connection to be added according to processing block 613. As shown in processing block 615, a circuit edit connection is then formed to couple the exposed passive diffusion to another node in the integrated circuit. In the event that a circuit designer wishes to cut a signal line, flow chart 603 shows that the semiconductor material above the circuit edit cut location is first thinned, as shown in processing block 617. Next, the signal line is exposed and cut at the circuit edit cut location, as shown in processing block 619.

Thus, what has been described is a method and apparatus for providing circuit edit structures to integrated circuits for circuit edits through the back side of a flip-chip packaged integrated circuit die. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and Figures are accordingly to be regarded as illustrative rather than restrictive.

What is claimed is:

1. In an integrated circuit die, a circuit edit structure, comprising:

a passive diffusion disposed in a semiconductor substrate of the integrated circuit die; and a plurality of contacts coupling the passive diffusion to a signal line disposed in a dielectric isolation layer of the integrated circuit die.

2. The circuit edit structure of claim 1 wherein the passive diffusion is laterally spaced in the semiconductor substrate of the integrated circuit die at least approximately 1.0 microns from a nearest diffusion disposed in the semiconductor substrate of the integrated circuit die.

3. The circuit structure of claim 1 further comprising a field oxide disposed in the semiconductor substrate of the integrated circuit die surrounding the passive diffusion.

4. The circuit edit structure of claim 1 wherein the integrated circuit die is included in a flip-chip packaged integrated circuit such that the circuit edit structure is accessed through a back side of the integrated circuit die for circuit editing.

5. The circuit edit structure of claim 3 wherein the signal line comprises a circuit edit cut location disposed in the dielectric isolation layer beneath the field oxide.

6. The circuit edit structure of claim 5 wherein the integrated circuit die is included in a flip-chip packaged integrated circuit such that the circuit edit cut location in the signal line is accessed through a back side of the integrated circuit die for circuit editing.

7. The circuit edit structure of claim 5 wherein the circuit edit cut location is located at approximately a center of an approximately 3.0 micron uninterrupted length of the signal line.

8. The circuit edit structure of claim 1 wherein the signal line comprises metal.

9. The circuit edit structure of claim 1 wherein the signal line comprises polysilicon.

10. The circuit edit structure of claim 1 wherein the passive diffusion is oversized in comparison to another active diffusion in the semiconductor substrate disposed in the integrated circuit die.

11. The circuit edit structure of claim 1 wherein the passive diffusion has a cross-sectional area of at least approximately 1.0 square microns.

12. The circuit edit structure of claim 1 wherein the passive diffusion comprises an N+ diffusion disposed in a P well disposed in the semiconductor substrate of the integrated circuit die.

13. The circuit edit structure of claim 1 wherein the passive diffusion comprises a P+ diffusion disposed in an N well disposed in the semiconductor substrate of the integrated circuit die.

* * * * *